United States Patent

[11] 3,614,560

[72] Inventor Narasipur G. Anantha
Hopewell Junction, N.Y.

[21] Appl. No. 889,047
[22] Filed Dec. 30, 1969
[45] Patented Oct. 19, 1971

[73] Assignee International Business Machines Corporation
Armonk, N.Y.

[54] IMPROVED SURFACE BARRIER TRANSISTOR
12 Claims, 4 Drawing Figs.

[52] U.S. Cl. .......... 317/235 R, 317/234 R, 317/235 E, 317/235 U, 317/235 X, 29/589
[51] Int. Cl. .......... H01l 19/00
[50] Field of Search .......... 317/234 (5.2), 234 (5.3), 235 (31), 235 (44)

[56] References Cited

UNITED STATES PATENTS 3,504,242 3/1970 Wolley .......... 317/235
3,460,003 8/1969 Hampikian .......... 317/234

*Primary Examiner*—John W. Huckert
*Assistant Examiner*—B. Estrin
*Attorneys*—William Kaufman and Barry Kramer

ABSTRACT: A semiconductor device comprising in combination: a first zone of semiconductive material containing impurity atoms of the acceptor type; a contiguous second zone of semiconductive material containing a predetermined low concentration of impurity atoms of the donor type; a metal layer having an interface with said second zone; and a third zone of relatively highly conductive semiconductive material in contact with said metal layer and containing a high concentration of impurity atoms of either the donor or acceptor type. In a typical device in accordance with this invention the "first zone" is formed as a P+ diffusion area in the "second zone" which is of the N-conductivity type of silicon, the "metal" is platinum, the "third zone" is formed by P+ diffusion into a monocrystalline silicon wafer, and emitter, base and collector leads are in contact with said first, second and third zones, respectively.

PATENTED OCT 19 1971 3,614,560

INVENTOR.
NARASIPUR G. ANANTHA
BY William Kaufman
ATTORNEY

IMPROVED SURFACE BARRIER TRANSISTOR

BACKGROUND OF INVENTION

1. Field of the Invention

This invention relates to semiconductor devices employing the rectifying properties of a Schottky barrier, i.e., a metal-semiconductor junction. It relates further to transistors in which a metal layer has interfaces with two semiconductor layers of different resistivities, the semiconductor of low resistivity producing an ohmic contact for the device. The invention relates further to techniques for the fabrication of such devices.

2. Description of the Prior Art

Semiconductor devices such as the typical junction transistors are constituted of a monocrystalline semiconductor body having a first region of one conductivity type between two regions of the opposite conductivity type, the interfaces of the intermediate or base region with the other two regions forming the base-emitter and base-collector junctions.

The performance of the junction transistor with respect to frequency response is dependent upon the collection efficiency charge carriers injected into the base, and the time required for these carriers to traverse the base. Generally, the base is made thin so that the time required for the charge carriers to traverse it is minimized. However, the difficulties attendant the formation of exceedingly thin films place practical limits on the use of this approach.

Another form of junction transistor which has been employed is the surface barrier type in which metallic electrodes of large surface areas contact a semiconductor body. The surface transistors of this type are not particularly efficient and attempts to improve efficiency have involved alloying the electrode material with the semiconductive material to introduce the emitter and the collector deeper into the semiconductor body. This modification of surface electrode approach tends to create new problems.

A departure from the aforementioned type of surface barrier transistor is described by Atalla in U.S. Pat. No. 3,121,809, issued Feb. 18, 1964. Atalla recognized that the efficiency of the injection of minority carriers into a semiconductor from a metal-semiconductor barrier is marginal because most of the current flowing across such barrier is carried by majority carriers flowing from the semiconductor into the metal. By forming a transistor comprising a thin base of metal between an emitter and a collector of semiconductor material, advantage is taken of the energetic majority carriers injected into the metallic base from the semiconductor emitter for collection by the semiconductor collector. Transistors of this type have only limited practical use because of the difficulties involved in forming the metal base over the collector electrode and then positioning the emitter crystal in intimate contact with the metal base, while leaving a portion of the base exposed for attachment of external connections thereto.

The Schottky barrier collector transistor, so named because the base-collector junction is a Schottky barrier with the metallic side as the collector region, has the advantages of practically zero storage time and practically zero collector series resistance. In addition, the collector can be formed by a wide choice of fabrication methods and materials. The principles of operation of such devices are described by G. A. May in "Solid State Electronics," Vol. XI, pages 613–619, (1968). The specific structures described therein have external contacts to the base and collector regions on the top surface and the emitter contact on the opposite surface. It is more difficult to interconnect integrated circuits when all external contacts are not made through the same plane of the device. Eliminating the requirement to make connections to different surfaces of the transistor would simplify fabrication and permit the use of a wider choice of methods and materials. There is a need, therefore, for transistor structure having the functional advantages of the Schottky barrier collector transistor and which can be fabricated with all external leads from one surface of the transistor.

It is an object of the present invention to provide such new and improved Schottky barrier collector transistors. Other objects will be apparent from the ensuing description of this invention.

SUMMARY OF THE INVENTION

In one aspect, the present invention is based upon the recognition of the fact that certain metals form a Schottky contact with lightly doped semiconductive materials and an ohmic contact with heavily doped semiconductive materials. The application of this phenomenon to the fabrication of transistors leads to novel devices in which the Schottky barrier is sandwiched between two semiconductive materials; not on one surface of the device, as had been necessary when following previously known fabrication modes. More specifically, transistors according to the present invention have a metal layer sandwiched between a lightly doped semiconductor of N-type conductivity acting as the base region of the transistor, and a heavily doped semiconductor of N-type conductivity is in turn contiguous with a region in which the semiconductor is of P-conductivity type, the resultant junction being the emitter-base junction of the transistor. The interface of the lightly doped semiconductor region and the metal layer forms a Schottky barrier which is the base-collector junction.

Thus a device can be fabricated in accordance with the present invention, using conventional plating, crystal growth and diffusion techniques. A heavily doped monocrystalline silicon substrate containing N-type impurity may be used as the starting material. On the top surface of the semiconductor body, spaced regions of platinum silicide and P+ type semiconductor are formed by known metallizing masking and diffusion techniques. Monocrystalline N-type silicon is grown epitaxially over the platinum silicide and P+ regions. Silica is then grown or deposited over the epi layer and windows are cut over the platinum silicide pads and P-type impurity diffused therein. Contact windows are opened to the N-type silicon layer. Metallization of the exposed P+ and N-semiconductor regions provide the emitter and base contacts, respectively. The collector contact can be made by metallization of the bottom surface of the N+ silicon starting material.

While the present invention comprehends the configuration in which external contacts are provided on opposite surfaces of a transistor, it is also advantageously used in fabricating devices in which the external contacts are on a single plane. For example, uniplanar devices can be achieved by diffusing a P-type impurity into an N-silicon substrate and depositing a platinum silicide pad within the resultant P+ area. Epitaxial growth of an N-type region and P+ diffusion therein over the platinum silicide pad to depth required for proper adjustment of the base width gives the base and emitter regions, respectively. P+diffusion through the epitaxial N-type region into the P+ region surrounding the platinum silicide pad provides the collector reach-through on the same surface as the contacts for the emitter and base regions. In such a device, although the P+ area is in contact with the base region as well as the metal collector, conduction will concentrate across the metal-to-semiconductor interface since the field is higher there than at the semiconductor-to-semiconductor interface.

The selection of materials for fabrication of the devices of the present invention need not be based upon special requirements. Semiconductor materials used to form the base region must be of N-type conductivity. The semiconductor region forming the ohmic contact to the metal collector region may be of any conductivity type and it must be more heavily doped than the semiconductor of the base region. The metal collector should be thin so as to permit epitaxial growth or deposit of monocrystalline silicon of N-conductivity type. Additionally any alloy or compound which the metal forms with the semiconductor substrate, should be stable under conditions required for the diffusion of the P-type dopant required for the emitter region. Platinum meets the requirements of the present invention most closely. Molybdenum, which also forms a Schottky barrier and an intermetallic compound with silicon, can also be used but molybdenum silicide does not have quite the same degree of heat stability as platinum silicide and is thus not as useful in the present invention. Other metals which form Schottky barriers, such as aluminum, do not form intermetallic silicides, but rather give alloys. These alloys are not heat stable and tend to migrate during high-temperature conditions required for later diffusion steps. Such migration changes the conductivity characteristics of the Schottky barrier and interferes with product quality and uniformity.

The semiconductor material used to form the ohmic contact with the metal collector region can be of any conductivity type but it should be highly conductive. The resistivity should be less than about 0.2Ω-cm. and preferably in the range of 0.002Ω-cm. to 0.01Ω-cm. Thus for the highly conductive semiconductor substrate used to form the ohmic contact with the metal collector, the concentration of impurity atoms should be at least about $10^{20}$ atoms per cc. The lower limit on impurity concentration is determined by the relative resistivity of the base region. As indicated above, the semiconductor used in the ohmic region should be more highly conductive than the base region. It is not critical, however, to use semiconductors of unlike conductivity types. Thus, both may be semiconductors of the N-conductivity type with, however, the ohmic area having a high concentration of impurity atoms.

As a practical matter, the base region must be constituted of a semiconductor of N-type conductivity. Germanium or silicon with any N-type impurity such as phosphorus, in a relatively low concentration (i.e., less than about $10^{17}$ atoms per cc.) provides the desired resistivity, ranging from 0.07 to 5.0Ω-cm. The ohmic region can be similarly constituted, i.e., it may be either germanium or silicon doped with any N-type impurity, but in a concentration greater than $10^{19}$ atoms per cc. so that this region is relatively conductive.

The devices of the present invention are prepared by conventional techniques. For instance, a metal such as platinum is deposited on the surface of a semiconductor having a high level of dopant and the deposit is diffused into the body by heating to a temperature in the range of about 400°–500° C. If the semiconductor body is silicon, then the diffusion results in the formation of the metal silicide. Similarly the germanicide is formed when the semiconductor body is germanium. The layer of N-type semiconductor is then deposited over the metal deposit to give the base region. A P-type emitter region is then formed, for example, by diffusion of a P-type impurity into the N-type base or by deposit of a monocrystalline semiconductor containing the P-type impurity. The P-type region becomes the emitter of the transistor device. The structure may also contain a P+ isolation wall surrounding the metal layer to isolate the transistor from other portions of the semiconductive device, thereby permitting the fabrication of the device in combination with other functionalities as an integrated circuit.

The foregoing and other objects, features and advantages of the invention will be apparent from the following more particular description of a preferred embodiment of the invention, as illustrated in the accompanying drawings.

DESCRIPTION OF THE DRAWINGS

The present invention will be more readily understood by reference to the accompanying drawings, in which.

Figure 1:
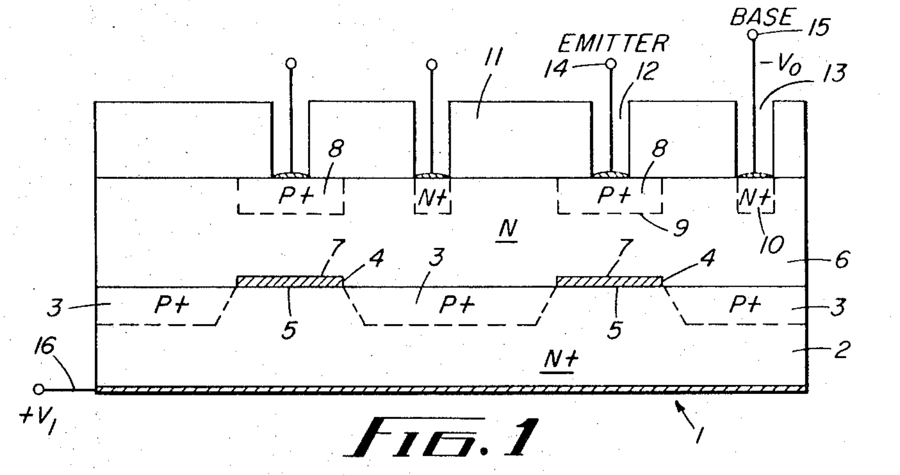
FIG. 1 is a plan view of a semiconductor device illustrating a biplanar transistor in accordance with the present invention.

In the drawings, only partial integrated circuits are shown, since the devices may be used in conjunction with additional elements as such elements may be needed to perform other electronic functions.

One form of the invention is shown in the biplanar transistor of FIG. 1. The device 1 is comprised of a semiconductor body 2 of low resistivity and predetermined conductivity type. In this instance the body 2 is silicon of N–conductivity type by reason of the inclusion of arsenic or phosphorous as the doping impurity, and has a resistance of less than 0.01Ω-cm. On the top surface of the body are spaced semiconductor regions 3 and metal regions 4. In this instance, region 3 is formed by diffusion of a donor impurity such as arsenic into the surface of the body 2; and metal region 4 is formed by evaporating or cathode sputtering deposition techniques using a mask to cover the P+ regions. The metal, platinum in this case, can be converted to a crystalline compound, the silicide, by heating in nitrogen at 400°–600° C. for about 20 minutes. Excess metal can be removed with hot aqua regia. The Pt Si region is in ohmic contact with body 2 at interface 5. N-conductivity-type base region 6 is then epitaxially grown over the spaced regions 3 and 4. The conductivity is adjusted by use of a predetermined amount of impurity, to a lower order of magnitude than region 2. The impurity concentration should be in the range of $10^{14}$ to $2\times10^{17}$ atoms per cc. to give a resistivity value ranging from 0.07 to 5.0Ω-cm. The junction 7 of regions 4 and 6 forms the Schottky barrier which serves as the collector in the device. P+ region 3, which separates N+ and N regions 2 and 6, decreases the edge effect and improves reverse voltage capability, thereby establishing the conductive channel through the Schottky barrier 4. P+ diffusion to a predetermined depth provides emitter region 8 and base-emitter junction 9. The depth to which the diffused region extends establishes the distance (i.e., B*w*) between emitter-base junction 9 and collector-base junction 7. The smaller B*w* is, the slower in the base series resistance and the charge carrier transit time. The only disadvantage to reducing B*w* is that maximum operating collector to emitter voltage is limited simultaneously by base punch-through and collector junction breakdown. N+ diffusion gives a low-resistance base contact 10. Silica layer 11 is grown and provided with windows 12 and 13 for emitter and base contacts 14 and 15, respectively. The collection contact 16 may be applied by suitable techniques.

Figure 2:
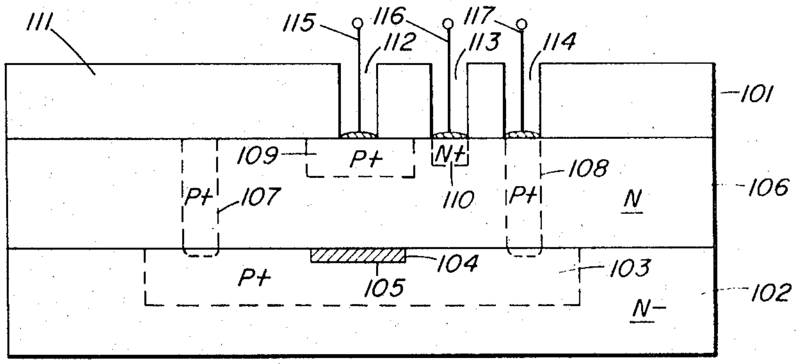
FIG. 2 is a plan view of a uniplanar transistor of the present invention in which the external contacts are available through one surface, and which can be easily integrated with other circuit components.

Referring now to FIG. 2, the device which is depicted has the especially desirable feature of having all external leads extending from a single plane. The device generally indicated by the numeral 101, has a monocrystalline silicon substrate 102 with highly conductive P+ diffusion region 103 extending to a predetermined depth downward from the top surface of 102. The P+ region 103 encompasses metal layer 104 which also extends downward from the top surface of substrate 102 but to a smaller depth than P+ region 103. By virtue of the high concentration of dopant in 103, metal layer 104 is in ohmic contact with P+ region 103 at interface 105. N-type conductive material 106 with a lower conductivity than P+ region 103, disposed on the top surface of substrate 102, has P-isolation wall 107 and collector reach-through 108, formed so as to extend through base 106 into P+ region 103. Emitter P+ region 109, disposed over metal layer 104, and base contact N+ region 110 extending only partially into base 106, are formed by suitable diffusion techniques. An oxide isolation layer 111 having windows 112, 113 and 114 over 109, 110 and 108, respectively, provides access for emitter lead 115, base lead 116 and collector lead 117.

The device of FIG. 2 has a Schottky barrier at the junction of metal layer 104 and N-type conductivity region 106. Thus, the P+ type region 109 and N-type region 106 form the emitter and base regions, respectively, of a transistor in which the collector is a Schottky barrier. The P+ region 103, surrounding the metal layer serves a twofold function. It provides a means of defining the limits of the device inasmuch as it is continuous with isolation walls 107 and 108. It further provides the highly conductive path by which ohmic contact can conveniently be made via P+ reach-through 108 to the Schottky barrier.

The operation of the device in FIG. 2 will now be described. Application of potential $+V_1$ at contact 117 gives a reverse bias to the collector junction and causes an electric field which attracts holes injected by the emitter into the base. This is the operating mode of the device. Now if the potential $V_1$ is changed to a negative voltage, no holes are injected from the metal into the base. Since the lifetime of charge carriers in the metallic collector is extremely short, i.e., $10^{114}$ seconds or less, there is practically no charge storage in the metallic collector. Thus, the response time is extremely short.

Figure 3:
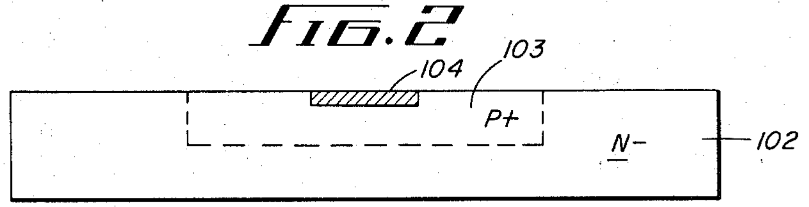
FIGS. 3 and 4 represent successive stages in the fabrication of the device of FIG. 2.
Figure 4:
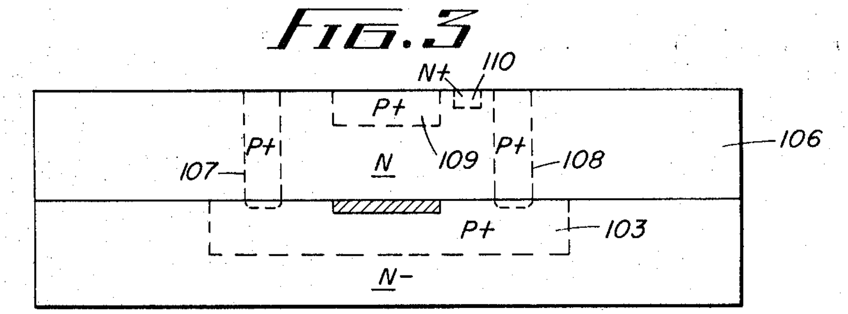

The process which may be used to fabricate the structure of FIG. 2 will be described with references to FIGS. 3 and 4, showing the devices at successive intermediate stages of production.

FIG. 3 shows a substrate of N-conductivity after there has been P+ diffusion 103 over the top surface thereof and formation of metal layer 104 over a portion of the surface defined by the P+ diffusion region. Specifically, the substrate is monocrystalline silicon, but germanium can be used instead of silicon. The P+ diffusion is conveniently performed selectively by depositing the P+ impurity, using known oxide masking techniques and redistributing it into the substrate by heating. The depth of the diffused area is not critical but the concentration of impurity within this region must be at least about $10^{20}$ atoms per cc. so as to provide a highly conductive path. Metal layer 104 is formed by evaporating or sputtering a 400–600 A layer of a metal such as platinum or molybdenum onto a portion of the surface defined by P+ region 103 using suitable masking techniques to protect the remainder of the substrate surface. The metal is reacted with silicon to form a silicide by heating in an inert gas for 20 minutes at 500°–600° C. and excess metal is then removed.

FIG. 4 shows the structure after there has been formed by epitaxial growth a layer of N-type semiconductor 106, P-isolation walls 107 and 108 extending therethrough into P+ region 103, P+ emitter region 109, and N+ base contact 110. A single diffusion operation can be used for introducing the donor-type impurity to regions 107, 108 and 109. The acceptor impurity for base contact 110 can be introduced separately but redistributed along with the P+ impurity in the same heating cycle. The depth to which the P+ impurity is diffused and the thickness of epitaxial layer 106 determine the base width of the device. In general, if the epi layer 106 is 2–4 microns, and the P+ impurity is diffused to a depth of 0.5 to 2.5 microns, this would provide a base width of about 1.5 microns. The optimum distances will depend in part on the concentration of impurity in the base region. As noted above the impurity concentration must be sufficiently low, i.e., less than $10^{17}$ atoms per cc., so that the semiconductor is of relatively high resistance, i.e., at least about 0.07Ω-cm. The reduced frequency response attendant the high base resistance can be in part avoided by reduction of base width and decrease in carrier transit time.

The particular resistivity values, semiconductors, impurities and design of the described devices are chosen on the basis of the characteristics desired of the final devices, and the use to which such devices are to be applied. Moreover, the devices, though shown on a single wafer, may be fabricated on a large slice of monocrystalline semiconductor material which is subsequently divided so as to provide separate devices. Contacts and wire connectors may be formed by any plating and bonding or thermocompression techniques.

What has been described is a Schottky barrier collector transistor in which external contact to the collector is through a highly conductive semiconductor, and if desired, all external leads extend from one and the same surface of the device.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A Schottky Barrier Collector Transistor having structure compatible with planar semiconductor technology comprising in combination:
   a. a first zone of semiconductor material containing impurity atoms of the acceptor type;
   b. a contiguous second zone of semiconductive material containing a predetermined low concentration of impurity atoms of the donor type;
   c. a thin embedded barrier metal layer having an interface with said second zone and forming a rectifying barrier junction with the second zone; and
   d. a third zone of relatively high-conductive semiconductive material in contact with said metal layer and containing a high concentration of impurity atoms of either the donor or acceptor type, said metal layer positioned between said second zone and said third zone and forming an ohmic contact with said third zone.

2. A semiconductor device in accordance with claim 1 wherein the third zone contains impurity atoms of the donor type.

3. A semiconductor device in accordance with claim 1 wherein the second and third zones are composed of material of like conductivity types.

4. A semiconductor device in accordance with claim 1 wherein the second and third zones are composed of material of unlike conductivity types.

5. A semiconductor device in accordance with claim 1 wherein the third zone has a resistance of less than $2\times10^{12}$Ω–cm.

6. A device according to claim 1 wherein the metal forming the metal layer is platinum or molybdenum.

7. A device according to claim 1 wherein the metal forming the metal layer is platinum.

8. A device according to claim 6 wherein the third zone has at least $10^{20}$ impurity atoms per cc. and a resistivity of less than $2\times10^{12}$Ω–cm.

9. A device according to claim 6 wherein the second zone has less than about $10^{17}$ impurity atoms per cc. and a resistivity of about 0.07 to 5.0Ω-cm.

10. A device according to claim 6 wherein the semiconductive material is monocrystalline silicon.

11. A device according to claim 6 wherein external contacts are made to said first, second and third zones.

12. A device according to claim 11 wherein the external contacts all extend from a single surface of said device.